US008423838B2

(12) United States Patent
Yeh

(10) Patent No.: US 8,423,838 B2
(45) Date of Patent: Apr. 16, 2013

(54) BLOCK MANAGEMENT METHOD, MEMORY CONTROLLER, AND MEMORY STORAGE APPARATUS

(75) Inventor: Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 375 days.

(21) Appl. No.: 12/960,546

(22) Filed: Dec. 6, 2010

(65) Prior Publication Data

US 2012/0096321 A1 Apr. 19, 2012

(30) Foreign Application Priority Data

Oct. 13, 2010 (TW) ................................ 99134922 A

(51) Int. Cl.
G06F 11/00 (2006.01)
(52) U.S. Cl.
USPC .......................................................... 714/710
(58) Field of Classification Search .................... 714/710
See application file for complete search history.

(56) References Cited

U.S. PATENT DOCUMENTS 8,127,071 B2* 2/2012 Kim et al. ..................... 711/103

| 2004/0078700 | A1* | 4/2004 | Jeong ............................... 714/42 |
| 2007/0038901 | A1* | 2/2007 | Shiota et al. ..................... 714/54 |
| 2010/0142275 | A1* | 6/2010 | Yogev et al. ............. 365/185.09 |
| 2010/0146228 | A1* | 6/2010 | Kanno et al. .................... 711/156 |
| 2010/0146239 | A1* | 6/2010 | Gabai et al. .................... 711/202 |
| 2010/0228940 | A1* | 9/2010 | Asnaashari et al. ........... 711/170 |
| 2011/0161727 | A1* | 6/2011 | Lee et al. ...................... 714/6.12 |

* cited by examiner

Primary Examiner — Bryce Bonzo
(74) Attorney, Agent, or Firm — Jianq Chyun IP Office

(57) ABSTRACT

A block management method for managing physical blocks of a rewritable non-volatile memory, and a memory controller and a memory storage apparatus using the same are provided. The method includes grouping the physical blocks into at least a data area, a free area, and a replacement area, and grouping the physical blocks of the data area and the free area into a plurality of physical units. The method also includes when one of the physical blocks belonging to of the physical units of the data area becomes a bad physical block, getting a physical block from the replacement area and replacing the bad physical block with the gotten physical block. The method further includes associating a physical unit that contains no valid data in the free area with the replacement area. Thereby, the physical blocks can be effectively managed and the access efficiency can be improved.

19 Claims, 15 Drawing Sheets

BLOCK MANAGEMENT METHOD, MEMORY CONTROLLER, AND MEMORY STORAGE APPARATUS

CROSS-REFERENCE TO RELATED APPLICATION

This application claims the priority benefit of Taiwan application serial no. 99134922, filed on Oct. 13, 2010. The entirety of the above-mentioned patent application is hereby incorporated by reference herein and made a part of this specification.

BACKGROUND

1. Technology Field

The present invention generally relates to a block management method, and more particularly, to a block management method for managing physical blocks of a rewritable non-volatile memory, and a memory controller and a memory storage apparatus using the same.

2. Description of Related Art

Along with the widespread of digital cameras, cell phones, and MP3 in recently years, the consumers' demand to storage media has increased drastically. Rewritable non-volatile memory is one of the most adaptable storage media to portable electronic products (for example, notebook computers) due to its many characteristics such as data non-volatility, low power consumption, small volume, non-mechanical structure, and fast access speed. A solid state drive (SSD) is a storage apparatus which uses a flash memory as its storage medium. Thereby, the flash memory industry has become a very important part of the electronic industry in recent years.

A sub memory module of a flash memory module has a plurality of physical blocks, and each of the physical blocks has a plurality of physical pages, wherein data has to be written into a physical block according to the sequence of the physical pages. In addition, a physical page containing data has to be erased before it is used for writing data again. Particularly, because physical block is the smallest unit for erasing data while physical page is the smallest unit for programming (i.e., writing) data, in the management of a flash memory module, the physical blocks are grouped into a replacement area, a data area, and a free area.

The physical blocks in the replacement area are used for replacing damaged physical blocks. To be specific, when a physical block in the data area is damaged, a memory management circuit of the storage apparatus gets a normal physical block from the replacement area to replace the bad physical block. In particular, if there is no more normal physical block in the replacement area for replacing the bad physical block, the storage apparatus is announced as being in a write-protect mode and cannot be used for storing data anymore.

The physical blocks in the data area have been used for storing data from a host system, and the physical blocks in the free area are used for substituting the physical blocks in the data area. Thus, the physical blocks in the free area are blank or available blocks (i.e., no data is recorded therein or data recorded therein is marked as invalid data). Namely, the physical pages in the physical blocks of the data area and the free area are alternatively mapped to the logical pages in the logical blocks to store data from the host system. For example, when a host system is about to write data into a specific logical page in a specific logical block of a storage apparatus, the memory management circuit of the storage apparatus gets a physical block from the free area as a substitute physical block, writes the data into a physical page in the substitute physical block, and records that the data of the logical page is stored in the physical page. Besides, the physical page that is originally mapped to the logical page in the data area is marked as invalid.

Particularly, if the number of available physical blocks in the free area is smaller than a predetermined threshold, the memory management circuit performs a data merging procedure. To be specific, in the data merging procedure, the memory management circuit gets a blank physical block from the free area and copies valid data in the substitute physical block and valid data in the corresponding physical block in the data area to the gotten blank physical block, so that the substitute physical block and the corresponding physical block in the data area can be erased and associated with the free area. However, the time for executing a write command is prolonged due to the data merging procedure performed by the memory management circuit. Thereby, how to effectively manage physical blocks to improve the access efficiency of a storage apparatus has become a major subject in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a block management method capable of effectively managing physical blocks of a rewritable non-volatile memory module and accordingly improving access efficiency.

The present invention is also directed to a memory controller capable of effectively managing physical blocks of a rewritable non-volatile memory module and accordingly improving access efficiency.

The present invention is further directed to a memory storage apparatus with improved access efficiency.

According to an exemplary embodiment of the present invention, a block management method for managing a plurality of physical blocks of a rewritable non-volatile memory is provided. The block management method includes grouping the physical blocks into at least a data area, a free area, and a replacement area. The block management method also includes when one of the physical blocks belonging to the data area becomes a bad physical block, getting a physical block from the replacement area and replacing the bad physical block with the gotten physical block. The block management method further includes associating a physical block that contains no valid data in the free area with the replacement area.

According to an exemplary embodiment of the present invention, a block management method for managing a plurality of physical blocks of a rewritable non-volatile memory is provided, wherein the physical blocks respectively belong to a first sub memory module and a second sub memory module. The block management method includes grouping the physical blocks into at least a data area, a free area, and a replacement area and grouping the physical blocks in the data area and the free area into a plurality of physical units, wherein each of the physical units includes one of the physical blocks of the first sub memory module and one of the physical blocks of the second sub memory module. The block management method also includes when one of the physical blocks belonging to the first sub memory module in the data area becomes a bad physical block, getting a physical block among the physical blocks of the first sub memory module in the replacement area and replacing the bad physical block with the gotten physical block. The block management method further includes determining whether the number of physical blocks belonging to the first sub memory module in the replacement area is smaller than a prepared replacement block number and when the number of physical blocks belonging to the first sub memory module in the replacement area is smaller than the prepared replacement block number, executing a replacement physical unit recovery procedure. Herein the replacement physical unit recovery procedure includes associating a physical unit that contains no valid data in the free area with the replacement area.

According to an exemplary embodiment of the present invention, a block management method for managing a plurality of physical blocks of a rewritable non-volatile memory is provided, wherein the physical blocks respectively belong to a first sub memory module and a second sub memory module. The block management method includes grouping the physical blocks into at least a data area, a free area, and a replacement area and grouping the physical blocks in the data area and the free area into a plurality of physical units, wherein each of the physical units includes one of the physical blocks of the first sub memory module and one of the physical blocks of the second sub memory module. The block management method also includes when one of the physical blocks belonging to the physical units in the data area becomes a bad physical block and the bad physical block belongs to the first sub memory module, determining whether there is an available physical block among the physical blocks belonging to the first sub memory module in the replacement area, and when there is the available physical block among the physical blocks belonging to the first sub memory module in the replacement area, replacing the bad physical block with the available physical block. The block management method further includes when there is no available physical block among the physical blocks belonging to the first sub memory module in the replacement area, associating one of a plurality of physical units that contains no valid data among the physical units belonging to the free area with the replacement area and replacing the bad physical block with a physical block belonging to the first sub memory module in the physical unit.

According to an exemplary embodiment of the present invention, a memory controller for managing a rewritable non-volatile memory module is provided, wherein the rewritable non-volatile memory module has a plurality of physical blocks. The memory controller includes a host interface, a memory interface, and a memory management circuit. The host interface is configured for coupling to a host system, and the memory interface is configured for coupling to a rewritable non-volatile memory module. The memory management circuit is coupled to the host interface and the memory interface and configured for executing the block management method described above.

According to an exemplary embodiment of the present invention, a memory storage apparatus including a connector, a rewritable non-volatile memory module, and a memory controller is provided. The rewritable non-volatile memory module has a plurality of physical blocks. The memory controller is coupled to the rewritable non-volatile memory module and the connector, and configured for executing the block management method described above.

According to an exemplary embodiment of the present invention, a block management method for managing a plurality of physical blocks of a rewritable non-volatile memory is provided. The block management method includes grouping the physical blocks into at least a data area, a free area, and a replacement area, wherein the physical blocks in the data area are used for storing data from a host system, the physical blocks in the free area are used for substituting the physical blocks in the data area, and the physical blocks in the replacement area are used for replacing damaged physical blocks. The block management method also includes detecting a physical block number of the replacement area, and when the physical block number of the replacement area is smaller than a prepared replacement block number, associating at least one physical block in the data area or the free area with the replacement area. Thereby, the physical blocks in the replacement area are variable.

As described above, exemplary embodiments of the present invention provide a block management method and a memory controller and a memory storage apparatus using the same, wherein physical blocks can be effectively used and accordingly access efficiency can be improved.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
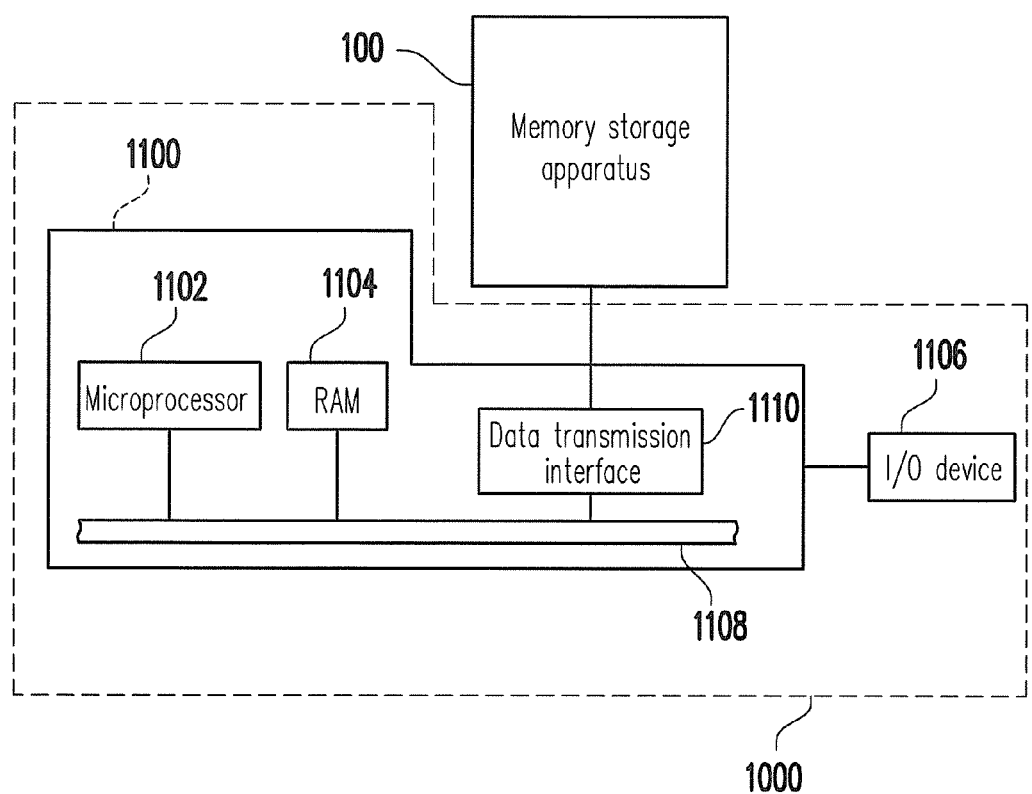
FIG. 1A illustrates a host system and a memory storage apparatus according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the block management method provided by the present invention, at least some available physical blocks in the replacement area are associated with the free area to be used. Besides, when one of the physical blocks in the data area becomes a bad physical block, a physical block is gotten from the replacement area to replace the bad physical block, and a physical block that contains no valid data in the free area is associated with the replacement area. Thereby, the physical blocks can be effectively used through the block management method provided by the present invention. Below, the present invention will be described in detail with reference to some exemplary embodiments.

First Exemplary Embodiment

Generally speaking, a memory storage apparatus (also referred to as a memory storage system) includes a rewritable non-volatile memory module and a controller (also referred to as a control circuit). The memory storage apparatus is usually used together with a host system so that the host system can write data into or read data from the memory storage apparatus.

FIG. 1A illustrates a host system and a memory storage apparatus according to the first exemplary embodiment of the present invention.

Figure 1B:
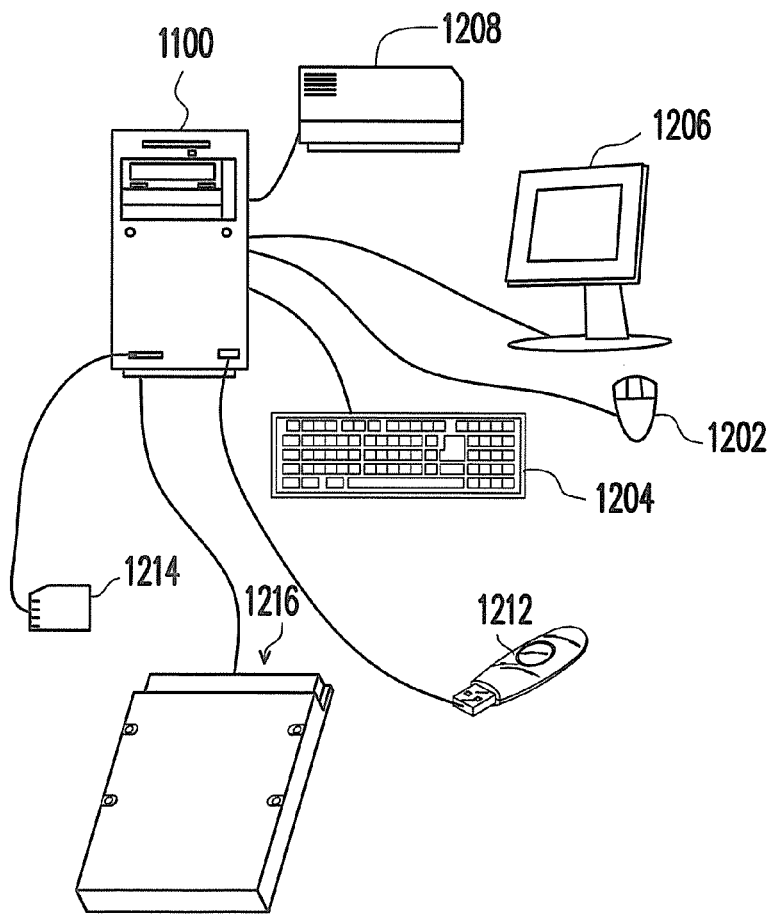
FIG. 1B is a diagram illustrating a computer, an input/output (I/O) device, and a memory storage apparatus according to an exemplary embodiment of the present invention.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the devices illustrated in FIG. 1B are not intended to limit the I/O device 1106, and the I/O device 1106 may further include other devices.

In the present embodiment, the memory storage apparatus 100 is coupled to other components of the host system 1000 through the data transmission interface 1110. Through the operations of the microprocessor 1102, the RAM 1104, and the I/O device 1106, data can be written into or read from the memory storage apparatus 100. The memory storage apparatus 100 may be a rewritable non-volatile memory storage apparatus, such as the flash drive 1212, the memory card 1214, or the solid state drive (SSD) 1216 illustrated in FIG. 1B.

Figure 1C:
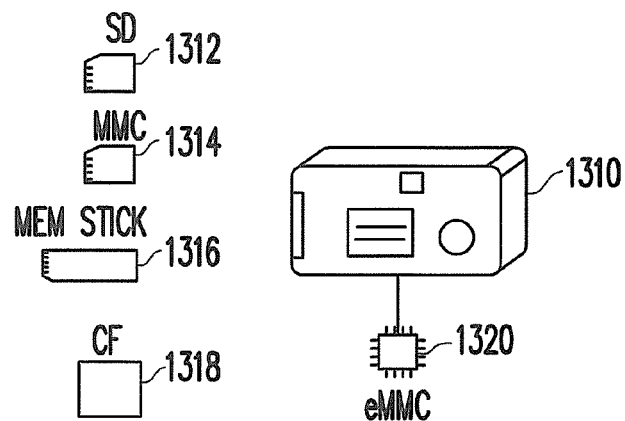
FIG. 1C is a diagram illustrating a host system and a memory storage apparatus according to another exemplary embodiment of the present invention.

Generally speaking, the host system 1000 can be substantially any system that works together with the memory storage apparatus 100 to store data. Even though in the present exemplary embodiment, the host system 1000 is described as a computer system, in another exemplary embodiment of the present invention, the host system 1000 may also be a digital camera, a video camera, a communication device, an audio player, or a video player. For example, if the host system is a digital camera (video camera) 1310, the rewritable non-volatile memory storage apparatus may be a secure digital (SD) card 1312, a multi media card (MMC) 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be noted that the eMMC is directly coupled to the motherboard of the host system.

Figure 2:
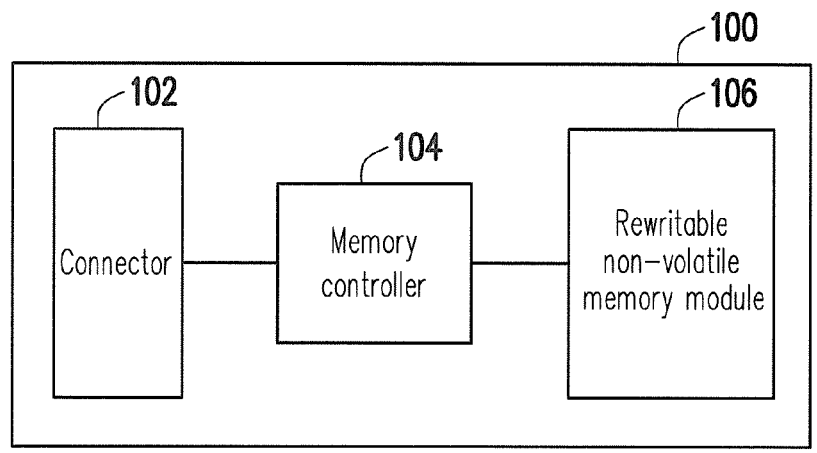
FIG. 2 is a schematic block diagram of the memory storage apparatus in FIG. 1A.

FIG. 2 is a schematic block diagram of the memory storage apparatus in FIG. 1A.

Referring to FIG. 2, the memory storage apparatus 100 includes a connector 102, a memory controller 104, and a rewritable non-volatile memory module 106.

In the present exemplary embodiment, the connector 102 is a serial advanced technology attachment (SATA) connector. However, the present invention is not limited thereto, and the connector 102 may also be an Institute of Electrical and Electronic Engineers (IEEE) 1394 connector, a peripheral component interconnect (PCI) express connector, a universal serial bus (USB) connector, a SD connector, a MS connector, a MMC connector, a CF connector, an integrated device electronics (IDE) connector, or any other suitable connector.

The memory controller 104 executes a plurality of logic gates or control instructions implemented in a hardware form or a firmware form and performs various data operations on the rewritable non-volatile memory module 106 according to instructions of the host system 1000. In the present exemplary embodiment, the memory controller 104 manages the rewritable non-volatile memory module 106 according to a block management method provided by an exemplary embodiment of the present invention. The block management method provided by an exemplary embodiment of the present invention will be described in detail below with reference to accompanying drawings.

The rewritable non-volatile memory module 106 is coupled to the memory controller 104 and used for storing data written by the host system 1000. In the present exemplary embodiment, the rewritable non-volatile memory module 106 is a multi level cell (MLC) NAND flash memory module. However, the present invention is not limited thereto, and the rewritable non-volatile memory module 106 may also be a single level cell (SLC) NAND flash memory module, any other flash memory module, or any other memory module having the same characteristics.

Figure 3:
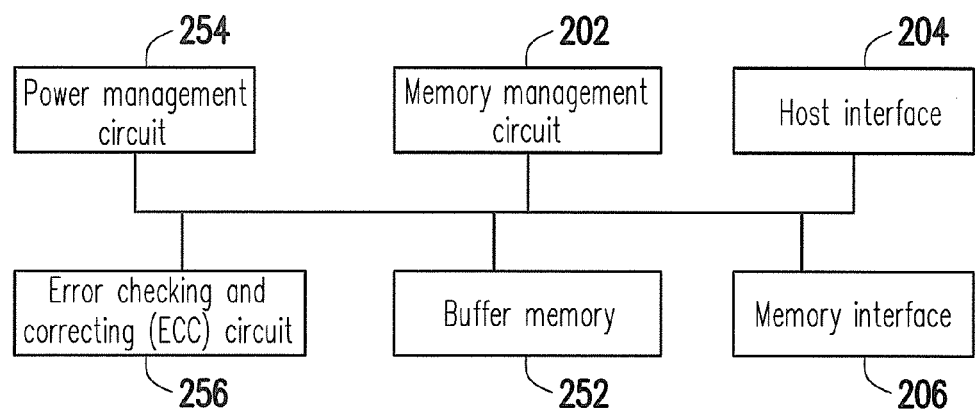
FIG. 3 is a schematic block diagram of a memory controller according to the first exemplary embodiment of the present invention.

FIG. 3 is a schematic block diagram of a memory controller according to the first exemplary embodiment of the present invention.

Referring to FIG. 3, the memory controller 104 includes a memory management circuit 202, a host interface 204, and a memory interface 206.

The memory management circuit 202 controls the operation of the memory controller 104. To be specific, the memory management circuit 202 has a plurality of control instructions. When the memory storage apparatus 100 is in operation, the control instructions are executed to manage the rewritable non-volatile memory module 106 according to the block management method in the present exemplary embodiment.

In the present exemplary embodiment, the control instructions of the memory management circuit 202 are implemented in a firmware form. For example, the memory management circuit 202 has a microprocessor unit (not shown) and a real-only memory (ROM, not shown), and the control instructions are burnt into the ROM. When the memory storage apparatus 100 is in operation, the control instructions are executed by the microprocessor unit to accomplish the block management method according to the present exemplary embodiment.

In another exemplary embodiment of the present invention, the control instructions of the memory management circuit 202 are stored in a specific area (for example, a system area exclusively used for storing system data in a memory module) of the rewritable non-volatile memory module 106 as program codes. In addition, the memory management circuit 202 has a microprocessor unit (not shown), a ROM (not shown), and a RAM (not shown). Particularly, the ROM has a driving code, and when the memory controller 104 is enabled, the microprocessor unit first executes the driving code to load the control instructions from the rewritable non-volatile memory module 106 into the RAM of the memory management circuit 202. After that, the microprocessor unit runs the control instructions to execute the block management method according to present exemplary embodiment. Moreover, in another exemplary embodiment of the present invention, the control instructions of the memory management circuit 202 may also be implemented in a hardware form.

The host interface 204 is coupled to the memory management circuit 202 and configured for receiving and identifying commands and data from the host system 1000. Namely, the commands and data received from the host system 1000 are transmitted to the memory management circuit 202 through the host interface 204. In the present exemplary embodiment, the host interface 204 is a SATA interface. However, the present invention is not limited thereto, and the host interface 204 may also be a PATA interface, an IEEE 1394 interface, a PCI express interface, a USB interface, a SD interface, a MS interface, a MMC interface, a CF interface, an IDE interface, or any other suitable data transmission interface.

The memory interface 206 is coupled to the memory management circuit 202 and configured for accessing the rewritable non-volatile memory module 106. Namely, data to be written into the rewritable non-volatile memory module 106 is converted by the memory interface 206 into a format acceptable to the rewritable non-volatile memory module 106.

In an exemplary embodiment of the present invention, the memory controller 104 further includes a buffer memory 252. The buffer memory 252 is coupled to the memory management circuit 202 and configured for temporarily storing data and commands from the host system 1000 or data from the rewritable non-volatile memory module 106.

In an exemplary embodiment of the present invention, the memory controller 104 further includes a power management circuit 254. The power management circuit 254 is coupled to the memory management circuit 202 and configured for controlling the power supply of the memory storage apparatus 100.

In an exemplary embodiment of the present invention, the memory controller 104 further includes an error checking and correcting (ECC) circuit 256. The ECC circuit 256 is coupled to the memory management circuit 202 and configured for executing an ECC procedure to ensure data accuracy. To be specific, when the memory management circuit 202 receives a write command from the host system 1000, the ECC circuit 256 generates an ECC code for the data corresponding to the write command, and the memory management circuit 202 writes the data corresponding to the write command and the corresponding ECC code into the rewritable non-volatile memory module 106. Subsequently, when the memory management circuit 202 reads the data from the rewritable non-volatile memory module 106, it simultaneously reads the corresponding ECC code, and the ECC circuit 256 executes the ECC procedure on the read data based on the ECC code.

Figure 4:
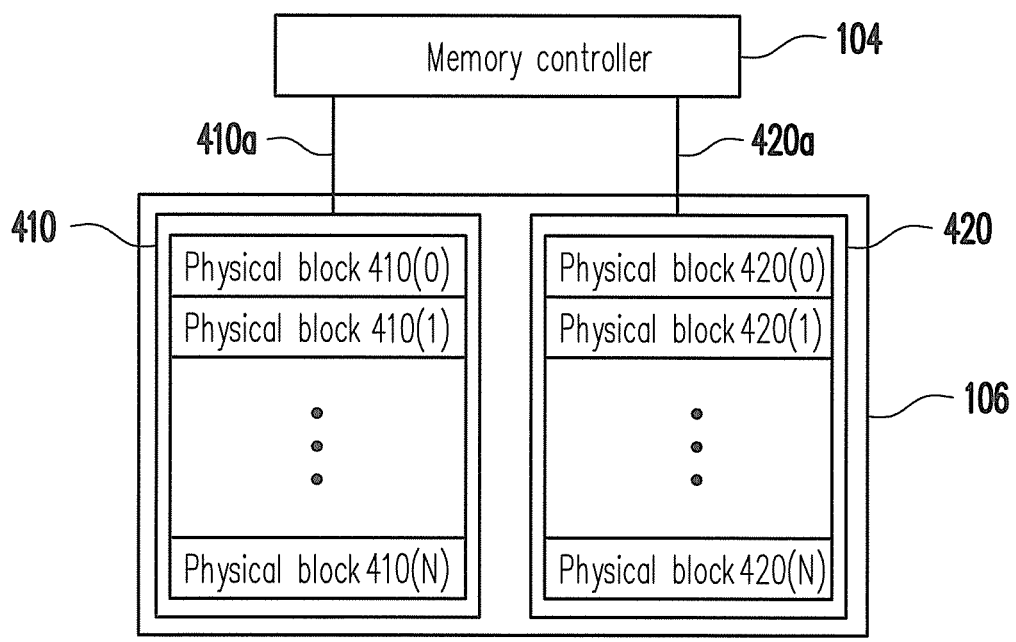
FIG. 4 is a schematic block diagram of a rewritable non-volatile memory module according to the first exemplary embodiment of the present invention.

FIG. 4 is a schematic block diagram of a rewritable non-volatile memory module according to the first exemplary embodiment of the present invention.

Referring to FIG. 4, the rewritable non-volatile memory module 106 includes a first sub memory module 410 and a second sub memory module 420. The first sub memory module 410 and the second sub memory module 420 may respectively be a memory die. The first sub memory module 410 has physical blocks 410(0)-410(N), and the second sub memory module 420 has physical blocks 420(0)-420(N). For example, the first sub memory module 410 and the second sub memory module 420 are respectively coupled to the memory controller 104 through an individual data bus 410a and an individual data bus 420a. However, in another exemplary embodiment of the present invention, the first sub memory module 410 and the second sub memory module 420 may also be coupled to the memory controller 104 through a single data bus. Each physical block of the first sub memory module 410 and the second sub memory module 420 has a plurality of physical pages, wherein the physical pages belonging to the same physical block can be individually written but have to be erased all together. For example, each physical block is composed of 128 physical pages. However, the present invention is not limited thereto, and each physical block may also be composed of 64 physical pages, 256 physical pages, or any other number of physical pages.

To be specific, physical block is the smallest unit for erasing data. Namely, each physical block contains the least number of memory cells that are erased together. Physical page is the smallest unit for programming data. Namely, physical page is the smallest unit for writing data. However, in another exemplary embodiment of the present invention, the smallest unit for writing data may also be sector or other unit. Each physical page usually includes a data bit area D and a redundancy bit area R. The data bit area D is used for storing user data, and the redundancy bit area R is used for storing system data (for example, ECC codes).

Even though a rewritable non-volatile memory module 106 having two sub memory modules is described in the present exemplary embodiment, the present invention is not limited thereto.

Figure 5:
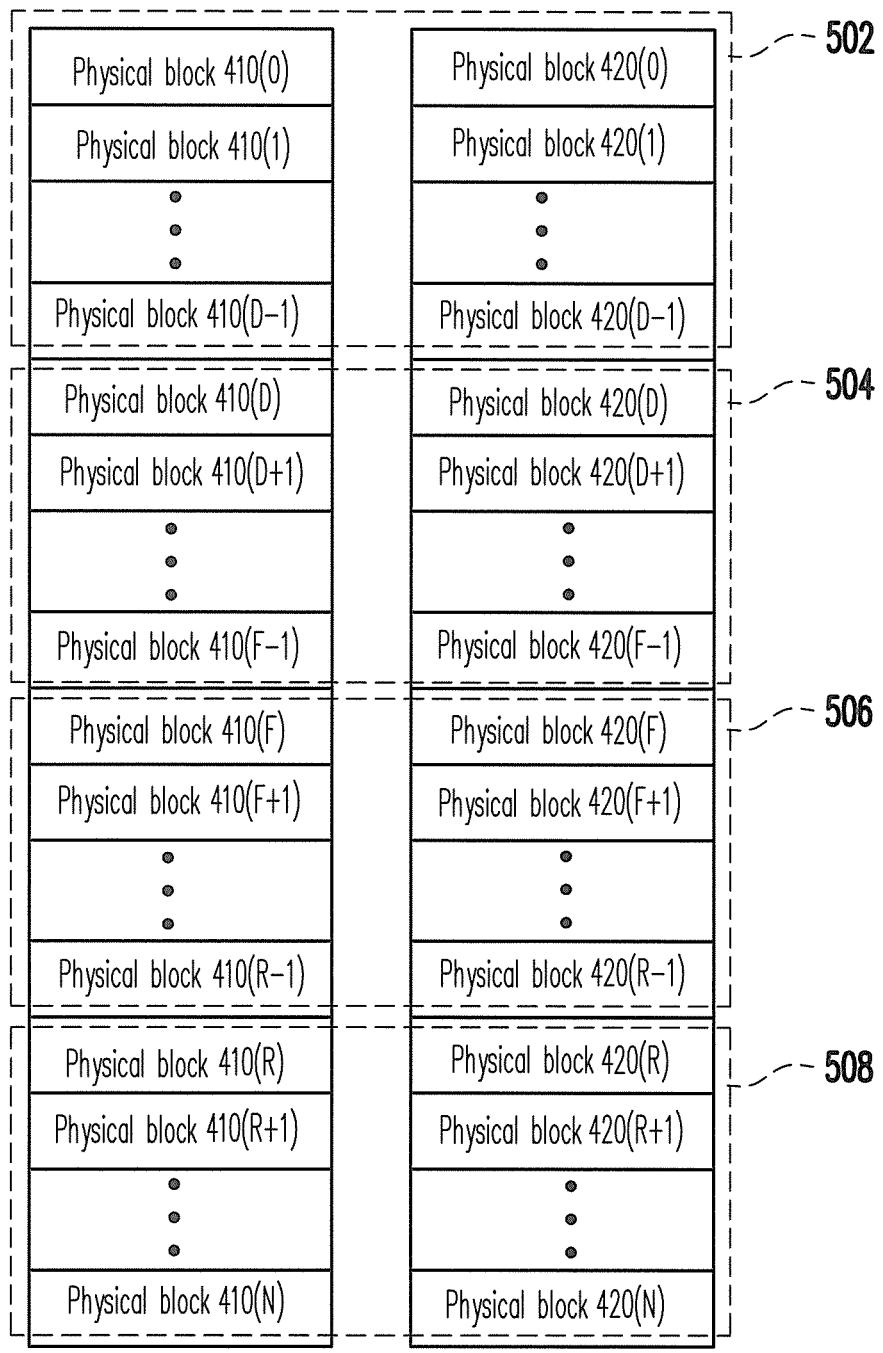
FIG. 5 is a diagram illustrating how physical blocks are managed according to the first exemplary embodiment of the present invention.

FIG. 5 is a diagram illustrating how physical blocks are managed according to the first exemplary embodiment of the present invention.

Referring to FIG. 5, the memory management circuit 202 of the memory controller 104 logically groups the physical blocks 410(0)-410-(N) and the physical blocks 420(0)-420(N) into a system area 502, a data area 504, a free area 506, and a replacement area 508.

The physical blocks logically belonging to the system area 502 are used for recording system data, such as the manufacturer and model of the rewritable non-volatile memory module, the number of physical blocks in the rewritable non-volatile memory module, and the number of physical pages in each physical block.

The physical blocks logically belonging to the data area 504 and the free area 506 are used for storing data from the host system 1000. To be specific, the physical blocks in the data area 504 are considered physical blocks containing data, and the physical blocks in the free area 506 are used for substituting the physical blocks in the data area 504. Namely, when a write command and a corresponding data are received from the host system 1000, the memory management circuit 202 gets a physical block from the free area 506 and writes the data into the gotten physical block, so as to substitute a physical block in the data area 504.

The physical blocks logically belonging to the replacement area 508 are used in a bad physical block replacement procedure for replacing damaged physical blocks. To be specific, if there are still normal physical blocks in the replacement area 508 and a physical block in the data area 504 is damaged, the memory management circuit 202 gets a normal physical block from the replacement area 508 to replace the damaged physical block. In the present exemplary embodiment, the memory management circuit 202 replaces bad physical blocks of the first sub memory module 410 by using normal physical blocks belonging to the first sub memory module 410 in the replacement area 508 and replaces bad physical blocks of the second sub memory module 420 by using normal physical blocks belonging to the second sub memory module 420 in the replacement area 508, so that the memory management circuit 202 can write data in parallel through the data bus 410a and the data bus 420a while executing a write command.

Figure 6A:
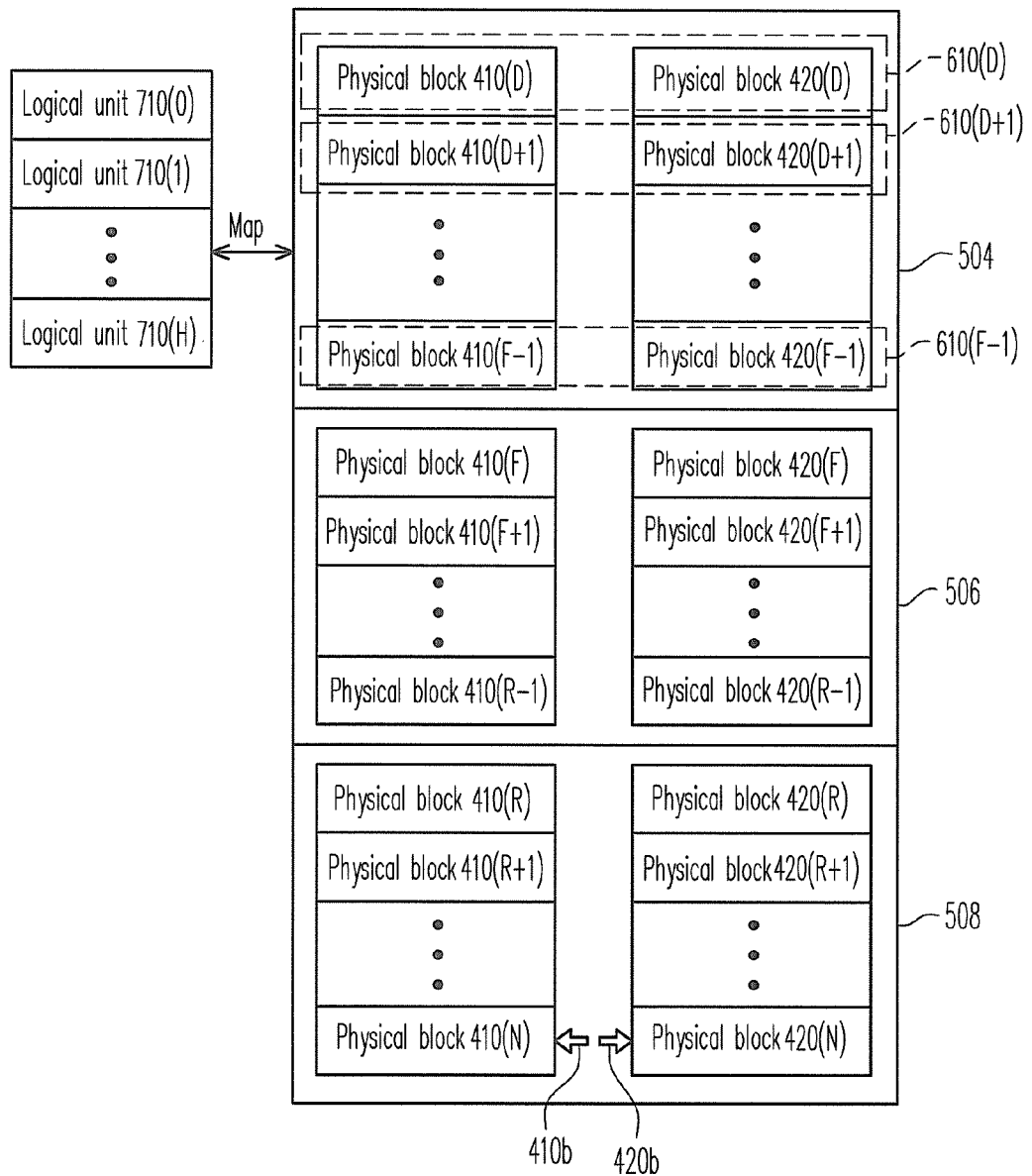
FIGS. 6A-6B illustrate an example of configuring physical blocks during the initialization procedure of a memory storage apparatus according to the first exemplary embodiment of the present invention.
Figure 6B:
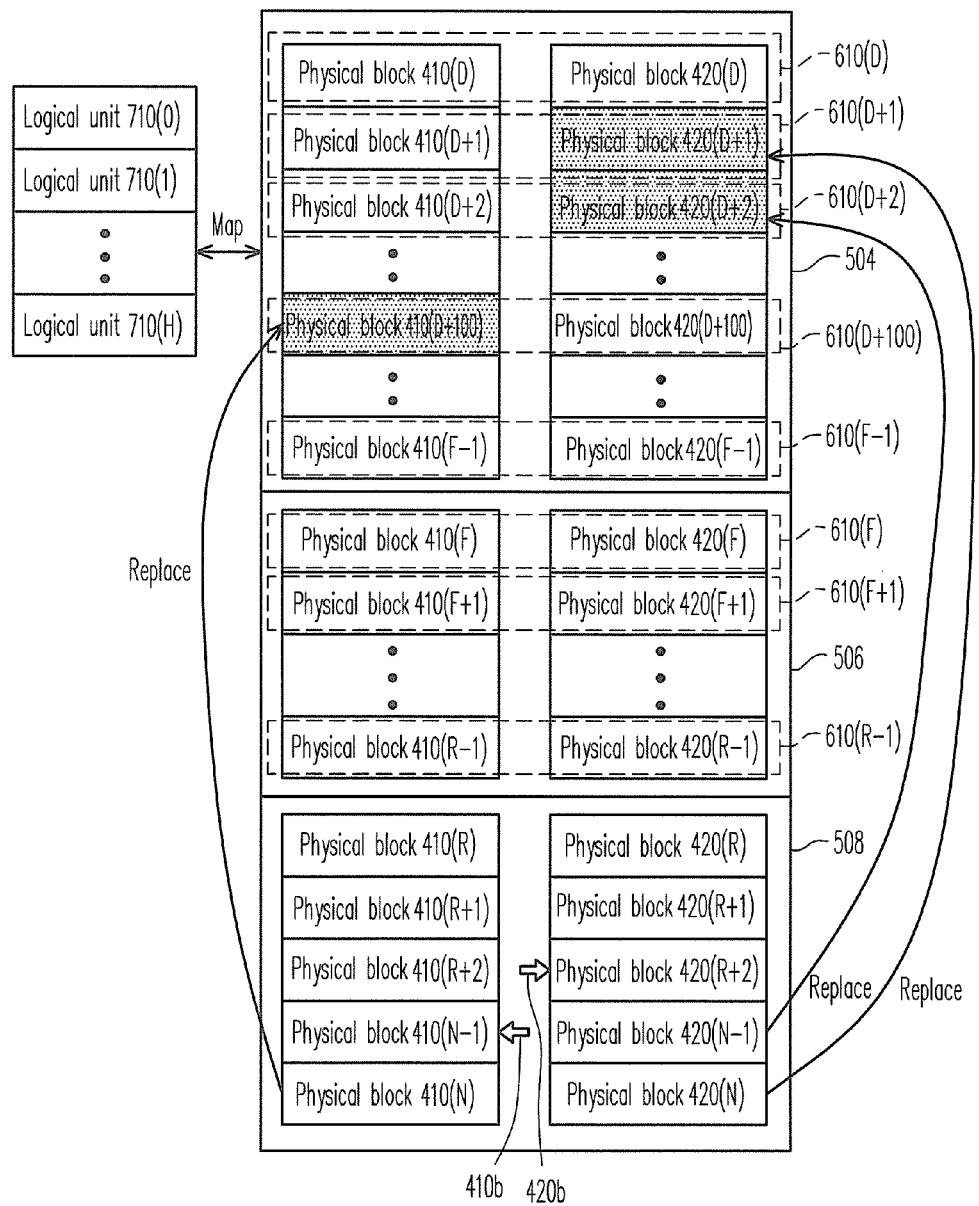

FIGS. 6A-6B illustrate an example of configuring physical blocks during the initialization procedure of a memory storage apparatus according to the first exemplary embodiment of the present invention.

Referring to FIG. 6A, when the memory storage apparatus 100 is powered on for the first time after it is manufactured, the memory management circuit 202 initially configures some physical blocks (for example, the physical blocks 410(D)-410(F−1) and the physical blocks 420(D)-420(F−1)) in the data area 504 according to the designed capacity of the memory storage apparatus 100 even though no data is actually stored in these physical blocks.

In particular, the memory management circuit 202 groups the physical blocks in the data area 504 into a plurality of physical units and manages the physical blocks in unit of physical units. For example, the physical blocks 410(D)-410(F−1) and the physical blocks 420(D)-420(F−1) are grouped into physical units 610(D)-610(F−1). In the present exemplary embodiment, each physical unit is composed of two physical blocks respectively belonging to different sub memory modules. However, the present invention is not limited thereto, and in another exemplary embodiment, each physical unit may be composed of at least one physical block of the same sub memory module or different sub memory modules.

In addition, the memory management circuit 202 configures the logical units 710(0)-710(H) to be mapped to the physical units belonging to the data area 504. Herein the memory management circuit 202 maintains a logical unit-physical unit mapping table to record the mapping relationship between the logical units 710(0)-710(H) and the physical units of the data area 504. To be specific, when the host system 1000 is about to access a specific logical access address, the memory management circuit 202 converts the logical access address to be accessed by the host system 1000 into a logical page in a corresponding logical unit and accesses data in the physical page of the corresponding physical unit according to the logical unit-physical unit mapping table.

Moreover, during the initialization procedure, the memory management circuit 202 determines whether there is any damaged physical block (i.e., bad physical block) among the physical blocks in the data area 504, and when there is a bad physical block, the memory management circuit 202 replaces the bad physical block with a physical block gotten from the replacement area 508. The memory management circuit 202 may mark the next available physical block among the normal physical blocks of each sub memory module in the replacement area 508 so that a bad physical block can be replaced conveniently. For example, the memory management circuit 202 initially marks the physical block 410(N) and the physical block 420(N)) with an indicator 410b and an indicator 420b.

As shown in FIG. 6B, assuming that the memory management circuit 202 detects a bad physical block (i.e., the physical block 410(D+100)) in the first sub memory module 410 during the initialization procedure, the memory management circuit 202 replaces the physical block 410(D+100) with the physical block 410(N) and points the indicator 410b to the physical block 410(N−1). Besides, assuming that the memory management circuit 202 detects two bad physical blocks (i.e., the physical block 420(D+1) and the physical block 420(D+2)) in the second sub memory module 420 during the initialization procedure, the memory management circuit 202 replaces the physical block 420(D+1) with the physical block 420(N) and the physical block 420(D+2) with the physical block 420(N−1) and points the indicator 420b to the physical block 420(R+2), wherein N is assumed to be R+4 in the present exemplary embodiment.

After the bad physical block replacement procedure during the initialization procedure is completed, the memory management circuit 202 reserves several physical blocks for each sub memory module in the replacement area 508, wherein the number of the reserved physical blocks has to be greater than or equal to a prepared replacement block number. To be specific, because each physical block can only be erased for a limited number of times (for example, 10000 times), during the operation of the memory storage apparatus 100, the physical blocks may be damaged after being erased for many times. However, if there is no more normal physical block in the replacement area 508 for replacing the bad physical blocks, the memory storage apparatus 100 cannot respond to an instruction of the host system 1000 instantly and accordingly a timeout problem may be produced. Accordingly, the memory management circuit 202 reserves an appropriate number of normal physical blocks in the replacement area 508.

In the present exemplary embodiment, the prepared replacement block number is set to 3. However, the present invention is not limited thereto. It should be mentioned that in the present exemplary embodiment, the memory management circuit 202 manages the rewritable non-volatile memory module 106 in unit of physical units that are respectively composed of two physical blocks respectively belonging to different sub memory modules, so that each sub memory module in the replacement area 508 may have a different number of physical blocks. For example, the physical blocks 410(R)-410(R+2) and the physical blocks 410(N−1) of the first sub memory module 410 are respectively configured in the replacement area 508, and the physical blocks 420(R)-420(R+2) of the second sub memory module 420 are configured in the replacement area 508.

Thereafter, the memory management circuit 202 configures the remaining physical blocks to the free area 506 and groups the physical blocks in the free area 506 into physical units (for example, the physical units 610(F)-610(R−1)). Similar to the data area 504, each physical unit in the free area 506 is also composed of a physical block in each sub memory module.

After the initialization procedure is completed, the memory storage apparatus 100 can receive write commands from the host system 1000 to write data.

For example, in an exemplary embodiment of the present invention, the memory management circuit 202 gets a physical unit from the free area 506 to write data received from the host system 1000. For example, when the host system 1000 is about to write data into a logical access address corresponding to the logical unit 710(0) and the logical unit 710(0) is currently mapped to the physical unit 610(0), the memory management circuit 202 gets the physical unit 610(F) from the free area 506 as a substitute physical unit (also referred to as a child physical unit) and writes the data into the physical unit 610(F). In particular, the memory management circuit 202 records the physical pages of the physical unit 610(0) mapped to the logical unit 710(0) in which data has been updated (i.e., data in these physical pages has become invalid data) and records the logical units to which the data in the physical pages of the physical unit 610(F) belongs. Accordingly, when the host system 1000 gives a read command, the memory management circuit 202 reads the corresponding data from the physical page in the corresponding physical block according to the logical unit-physical unit mapping table and the recorded information. In addition, when all the data in the physical unit 610(0) becomes invalid data, the memory management circuit 202 gets a blank physical unit (for example, the physical unit 610(F+1)) from the free area 506, executes a data merging procedure to sequentially copy valid data belonging to the logical unit 710(0) to the physical unit 610(F+1), and re-maps the logical unit 710(0) to the physical unit 610(F+1) in the logical unit-physical unit mapping table. Namely, the physical unit 610(F+1) is associated with the data area 504, and the physical unit 610(0) is associated with the free area 506. Accordingly, in the present exemplary embodiment, during the operation of the memory storage apparatus 100, the physical units are alternatively used for storing data written by the host system 1000, and the grouping relationship of the physical blocks dynamically changes.

As described above, a physical block may become a bad physical block after it is erased for many times. Thus, in the present exemplary embodiment, when a bad physical block is detected during the operation of the memory storage apparatus 100, the memory management circuit 202 executes aforementioned bad physical block replacement procedure and adjusts the configurations of the free area 506 and the replacement area 508 according to the number of available physical blocks in the replacement area 508.

Figure 7A:
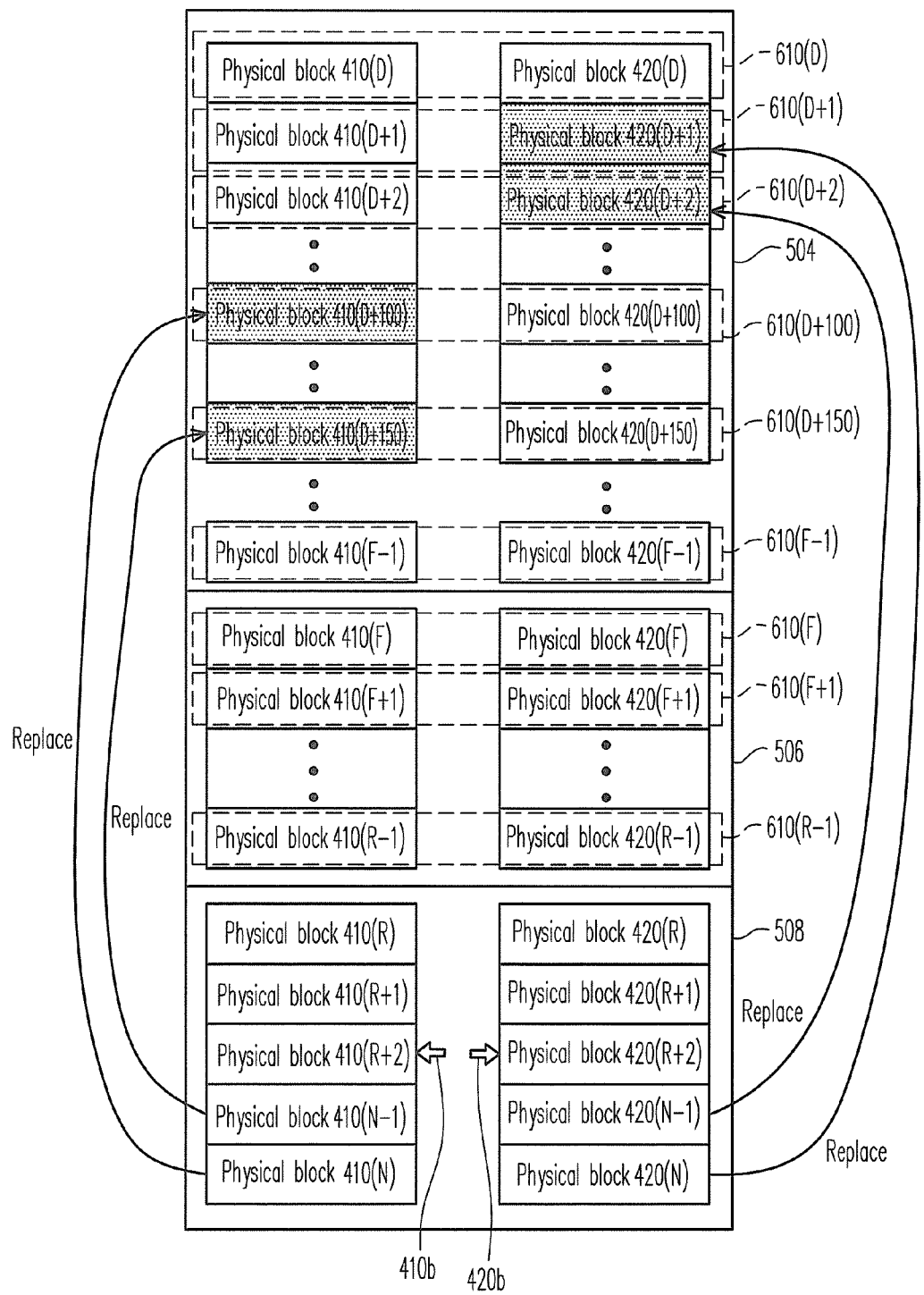
FIG. 7A illustrates an example of how a bad physical block is processed according to the first exemplary embodiment of the present invention.

FIG. 7A illustrates an example of how a bad physical block is processed according to the first exemplary embodiment of the present invention.

Referring to FIG. 7A, if the configurations of the free area 506 and the replacement area 508 are as shown in FIG. 6B and the physical block 410(D+150) of the first sub memory module 410 becomes a bad physical block, the memory management circuit 202 replaces the physical block 410(D+150) with the physical block 410(N−1) according to the indicator 410b and points the indicator 410b to the physical block 410(R+2). In particular, because the number of available physical blocks in the replacement area 508 that belong to the first sub memory module 410 is still greater than or equal to the prepared replacement block number (for example, as described above, in the present exemplary embodiment, the prepared replacement block number is set to 3), the memory management circuit 202 does not adjust the configurations of the free area 506 and the replacement area 508.

Figure 7B:
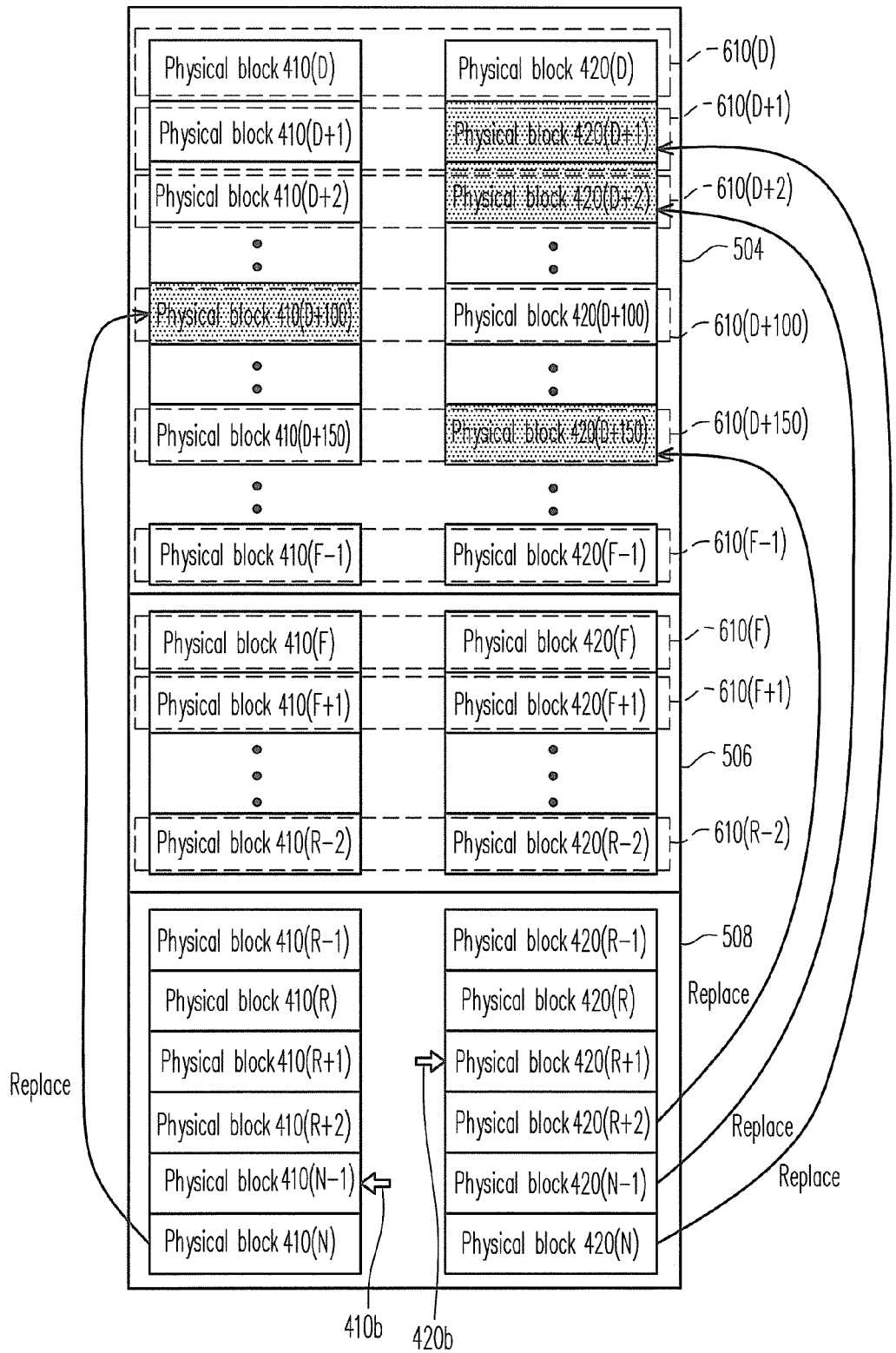
FIG. 7B illustrates another example of how a bad physical block is processed according to the first exemplary embodiment of the present invention.

FIG. 7B illustrates another example of how a bad physical block is processed according to the first exemplary embodiment of the present invention.

Referring to FIG. 7B, if the configurations of the free area 506 and the replacement area 508 are as shown in FIG. 6B and the physical block 420(D+150) of the second sub memory module 420 becomes a bad physical block, the memory management circuit 202 replaces the physical block 420(D+150) with the physical block 420(R+2) according to the indicator 420b and points the indicator 420b to the physical block 420(R+1). In particular, because the number of available physical blocks in the replacement area 508 that belong to the second sub memory module 420 is smaller than the prepared replacement block number, the memory management circuit 202 executes a replacement physical unit recovery procedure.

In the replacement physical unit recovery procedure, the memory management circuit 202 associates any one physical unit that contains no valid data in the free area 506 with the replacement area 508. For example, as shown in FIG. 7B, if the physical unit 610(R−1) does not contain any valid data, the memory management circuit 202 associates the physical block 410(R−1) and the physical block 420(R−1) of the physical unit 610(R−1) with the replacement area 508. Thus, the number of available physical blocks in the second sub memory module 420 remains as 3, and the number of available physical units in the free area 506 is reduced by 1.

It should be mentioned that while executing write commands of the host system 1000, the memory management circuit 202 keeps getting physical blocks from the free area 506 as substitute physical blocks for writing data as long as there are still available physical units in the free area 506, so that execution of the data merging procedure can be avoided and the performance of the memory storage apparatus 100 can be improved. In other words, because physical blocks are gotten from the free area 506 for substituting the physical blocks in the replacement area 508, the physical blocks or physical block addresses corresponding to the replacement area 508 are variable. Thus, when one of the physical blocks belonging to the data area 504 becomes a bad physical block and accordingly the replacement physical unit recovery procedure is executed, all the physical units in the free area 506 may have been gotten as substitute physical blocks and there may be no blank physical unit. Accordingly, the memory management circuit 202 executes the data merging procedure by executing one or multiple write commands to erase those physical units in the data area 504 that contain no valid data and associate the erased physical units with the free area 506, so that there are physical units containing no valid data in the free area 506.

In the example illustrated in FIG. 7B, when a bad physical block is detected and all the physical units 610(F)-610(R−1) contain valid data, the memory management circuit 202 temporarily does not adjust the physical units in the free area 506. Besides, when subsequently a write command is executed, the memory management circuit 202 gradually sorts the valid data to release the physical units. For example, once all the data stored in a specific physical unit (for example, the physical unit 610(R−1)) becomes invalid, the memory management circuit 202 associates the physical unit with the free area 506 and executes the replacement physical unit recovery procedure. Accordingly, aforementioned prepared replacement block number is set to 3 to prevent such situation that there is no available physical block in the replacement area 508 for replacing a bad physical block before the replacement physical unit recovery procedure is completed.

In another exemplary embodiment of the present invention, the memory management circuit 202 maintains a replacement physical block queue table to record the physical blocks belonging to the replacement area 508. Particularly, the memory management circuit 202 points the indicator 410b and the indicator 420b to the next normal physical block according to information in the replacement physical block queue table.

Figure 8A:
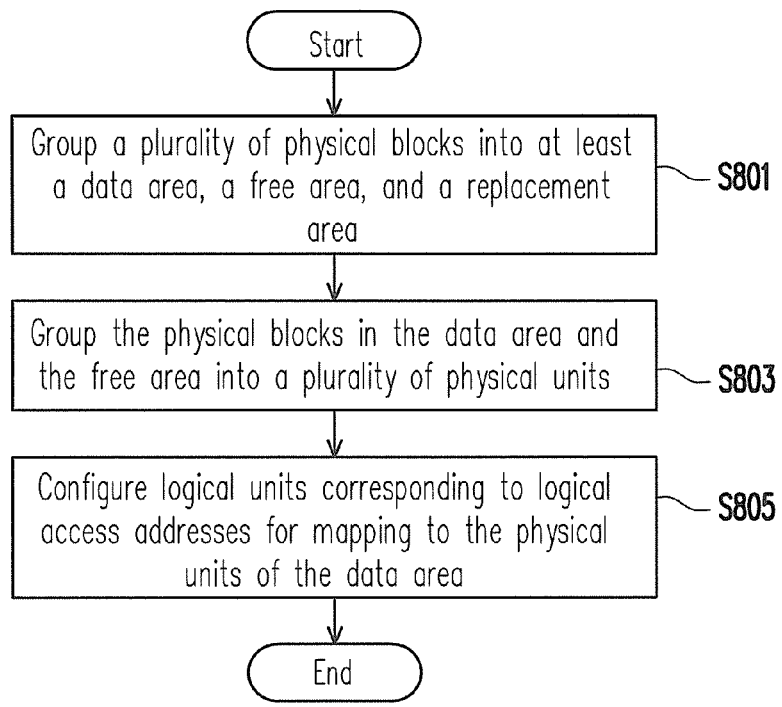
FIGS. 8A-8C are flowcharts of a block management method according to the first exemplary embodiment of the present invention.
Figure 8B:
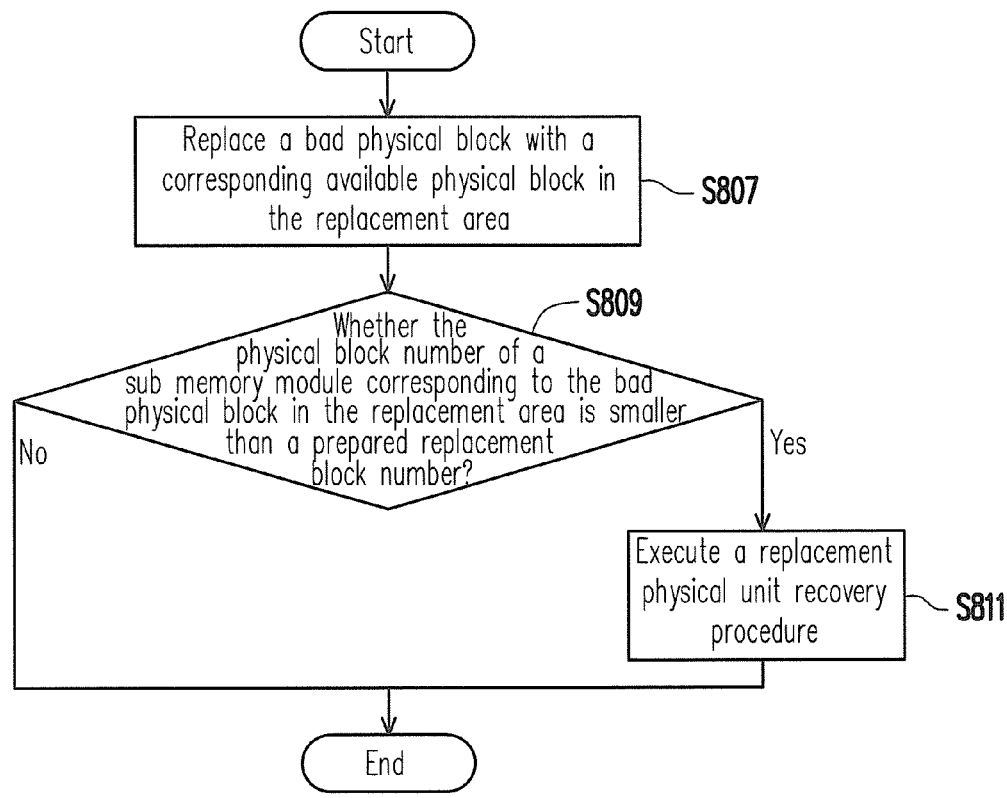

FIG. 8A and FIG. 8B are flowcharts of a block management method according to the first exemplary embodiment of the present invention, wherein FIG. 8A illustrates the management steps when the memory storage apparatus 100 is initialized, and FIG. 8B illustrates the management steps when a bad physical block is detected during the operation of the memory storage apparatus 100.

Referring to FIG. 8A, in step S801, the memory management circuit 202 groups the physical blocks into at least a data area 504, a free area 506, and a replacement area 508. The configurations of the data area 504, the free area 506, and the replacement area 508 have been described above therefore will not be described herein.

In step S803, the memory management circuit 202 groups the physical blocks in the data area 504 and the free area 506 into a plurality of physical units. In step S805, the memory management circuit 202 configures logical units for mapping to the physical units belonging to the data area 504. How the physical blocks are grouped into the physical units to be mapped to the logical units has been described above therefore will not be described herein.

After the initialization procedure in FIG. 8A is completed, during the operation of the memory storage apparatus 100, the memory management circuit 202 constantly monitors all the physical blocks, and when a bad physical block is detected, the memory management circuit 202 executes the steps illustrated in FIG. 8B.

Referring to FIG. 8B, in step S807, the memory management circuit 202 replaces the bad physical block with a corresponding available physical block in the replacement area 508. To be specific, in the present exemplary embodiment, the memory management circuit 202 gets an available physical block from the replacement area 508 according to the sub memory module corresponding to the bad physical block and the corresponding indicator to replace the bad physical block.

In step S809, the memory management circuit 202 determines whether the physical block number of the sub memory module corresponding to the bad physical block in the replacement area 508 is smaller than the prepared replacement block number.

When the physical block number of the sub memory module corresponding to the bad physical block in the replacement area 508 is not smaller than the prepared replacement block number, the procedure in FIG. 8B is terminated.

When the physical block number of the sub memory module corresponding to the bad physical block in the replacement area 508 is smaller than the prepared replacement block number, in step S811, the memory management circuit 202 executes the replacement physical unit recovery procedure.

Figure 8C:
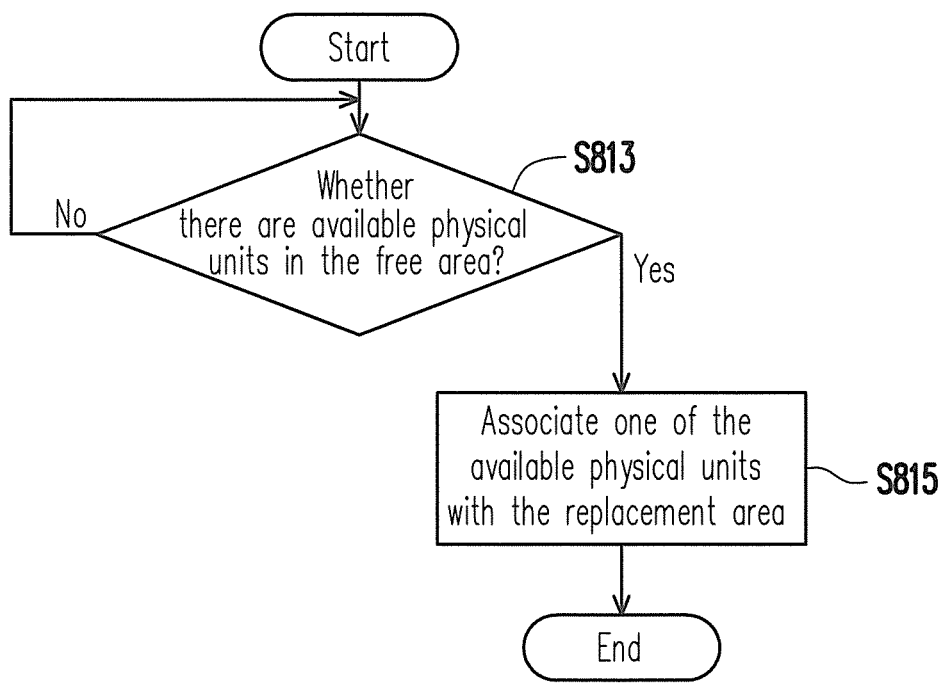

FIG. 8C is a flowchart of the replacement physical unit recovery procedure according to the first exemplary embodiment of the present invention.

Referring to FIG. 8C, in step S813, the memory management circuit 202 determines whether there are available physical units (i.e., blank physical units) in the free area 506. If there are blank physical units in the free area 506, in step S815, the memory management circuit 202 associates one of the available physical units with the replacement area 508. If there is no available physical unit in the free area 506, step S813 is continuously executed. To be specific, the memory management circuit 202 determines whether there are still available physical units in the free area 506 every time after a write command is executed until the physical units are recovered to the replacement area 508.

Second Exemplary Embodiment

The memory storage apparatus and the host system in the second exemplary embodiment of the present invention are substantially the same as those in the first exemplary embodiment of the present invention, and the difference is that the memory controller in the second exemplary embodiment uses a different block management method to configure the free area and the replacement area. Below, the difference between the first and the second exemplary embodiment will be described with reference to FIG. 1A, FIG. 2, and FIG. 3.

In the present exemplary embodiment, after the bad physical block replacement procedure in the initialization procedure is completed, the memory management circuit 202 configures all the physical blocks in the replacement area 508 that can be constructed into physical units to the free area 506 to be used for writing data.

Figure 9:
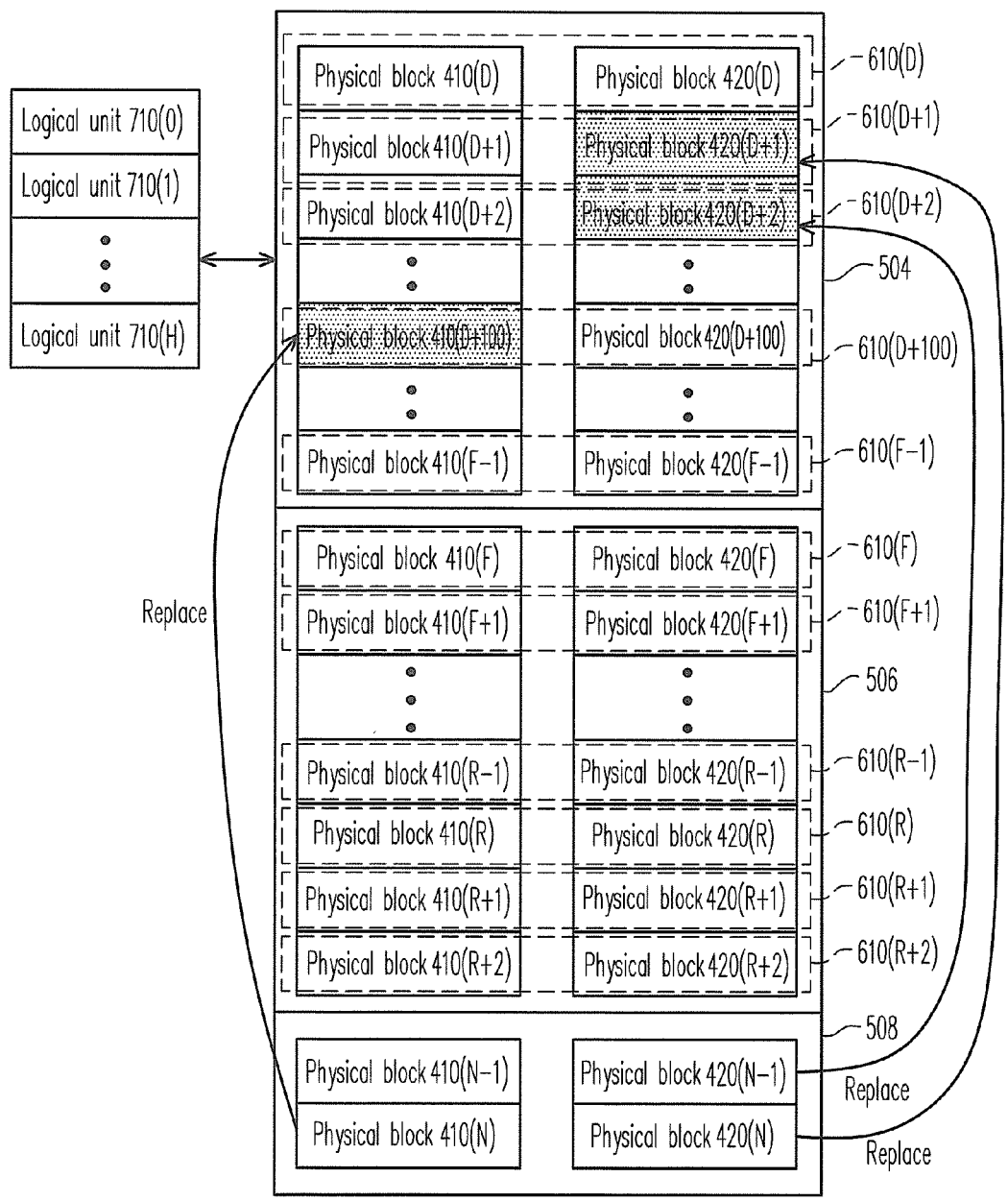
FIG. 9 illustrates an example of configuring physical blocks during the initialization procedure of a memory storage apparatus according to a second exemplary embodiment of the present invention.

FIG. 9 illustrates an example of configuring physical blocks during the initialization procedure of a memory storage apparatus according to a second exemplary embodiment of the present invention.

Referring to FIG. 9, the method for configuring the physical units in the data area 504 to be mapped to the logical units is the same as that described in the first exemplary embodiment therefore will not be described herein.

Assuming that the memory management circuit 202 detects a bad physical block (i.e., the physical block 410(D+ 100)) in the first sub memory module 410 during the initialization procedure, the memory management circuit 202 replaces the physical block 410(D+100) with the physical block 410(N). In addition, assuming that the memory management circuit 202 detects two bad physical blocks (i.e., the physical block 420(D+1) and the physical block 420(D+2)) in the second sub memory module 420 during the initialization procedure, the memory management circuit 202 replaces the physical block 420(D+1) with the physical block 420(N) and replaces the physical block 420(D+2) with the physical block 420(N−1). Thereafter, the memory management circuit 202 configures all the physical blocks in the replacement area 508 that can be constructed into physical units to the free area 506 and groups the physical blocks in the free area 506 into physical units. To be specific, as described above, in the present exemplary embodiment, each physical unit is composed of a physical block in each sub memory module. Thus, in the present embodiment, the memory management circuit 202 configures the physical blocks 410(R)-410(R+2) and the physical blocks 420(R)-420(R+2) in the replacement area 508 to the free area 506. Besides, the physical blocks 410(F)-

410(R+2) and the physical blocks 420(F)-420(R+2) are grouped into the physical units 610(F)-610(R+2) to be managed.

In addition, the memory management circuit 202 may maintain a replacement physical block queue table for recording available physical blocks (for example, the physical block 410(N−1) in FIG. 9) in the replacement area 508 that can be used for replacing bad physical blocks.

Figure 10A:
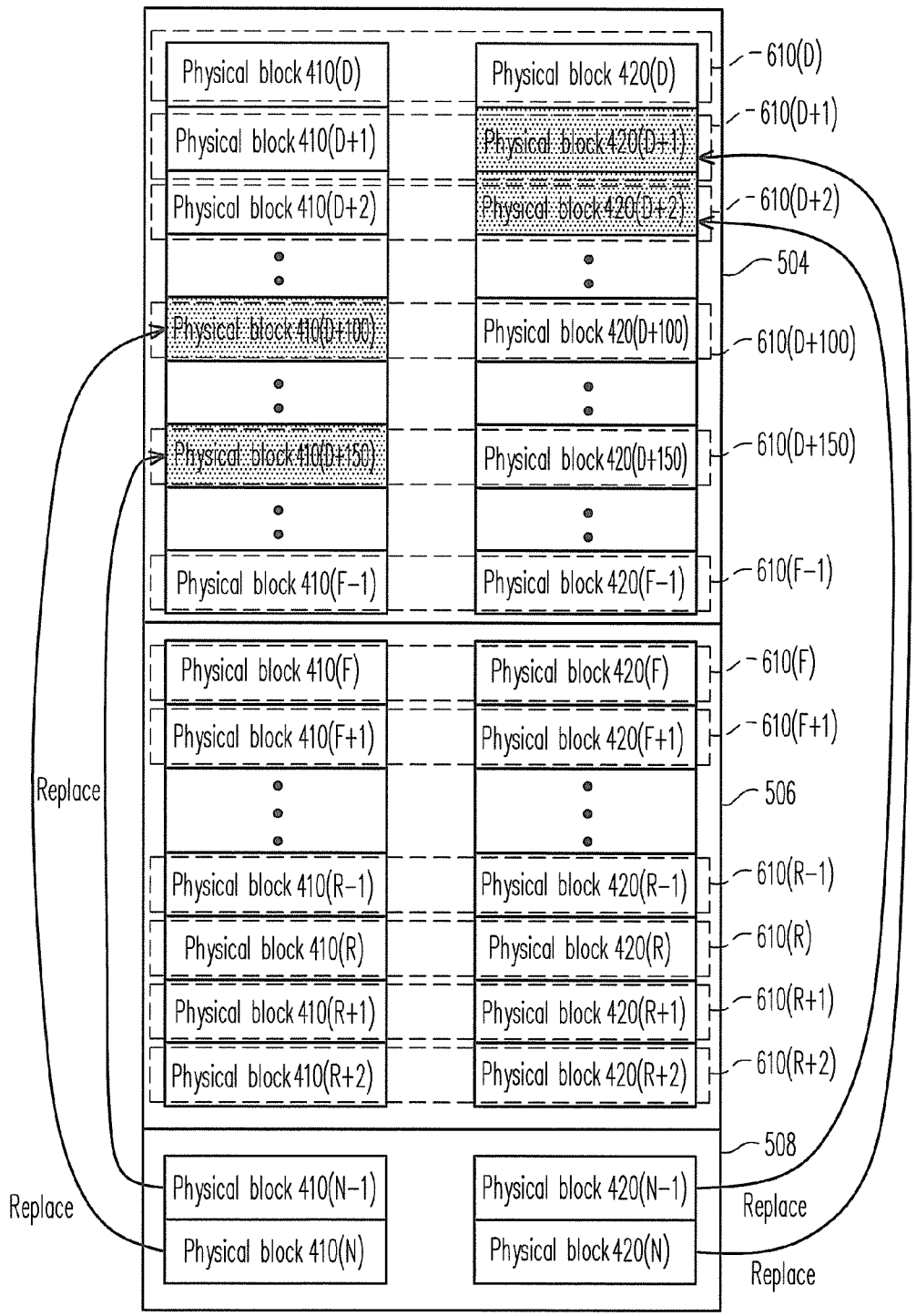
FIG. 10A illustrates an example of how a bad physical block is processed according to the second exemplary embodiment of the present invention.

FIG. 10A illustrates an example of how a bad physical block is processed according to the second exemplary embodiment of the present invention.

Referring to FIG. 10A, if the configurations of the free area 506 and the replacement area 508 are as shown in FIG. 9 and the physical block 410(D+150) of the first sub memory module 410 becomes a bad physical block, the memory management circuit 202 replaces the physical block 410(D+150) with the physical block 410(N−1) of the first sub memory module 410 according to the replacement physical block queue table.

Figure 10B:
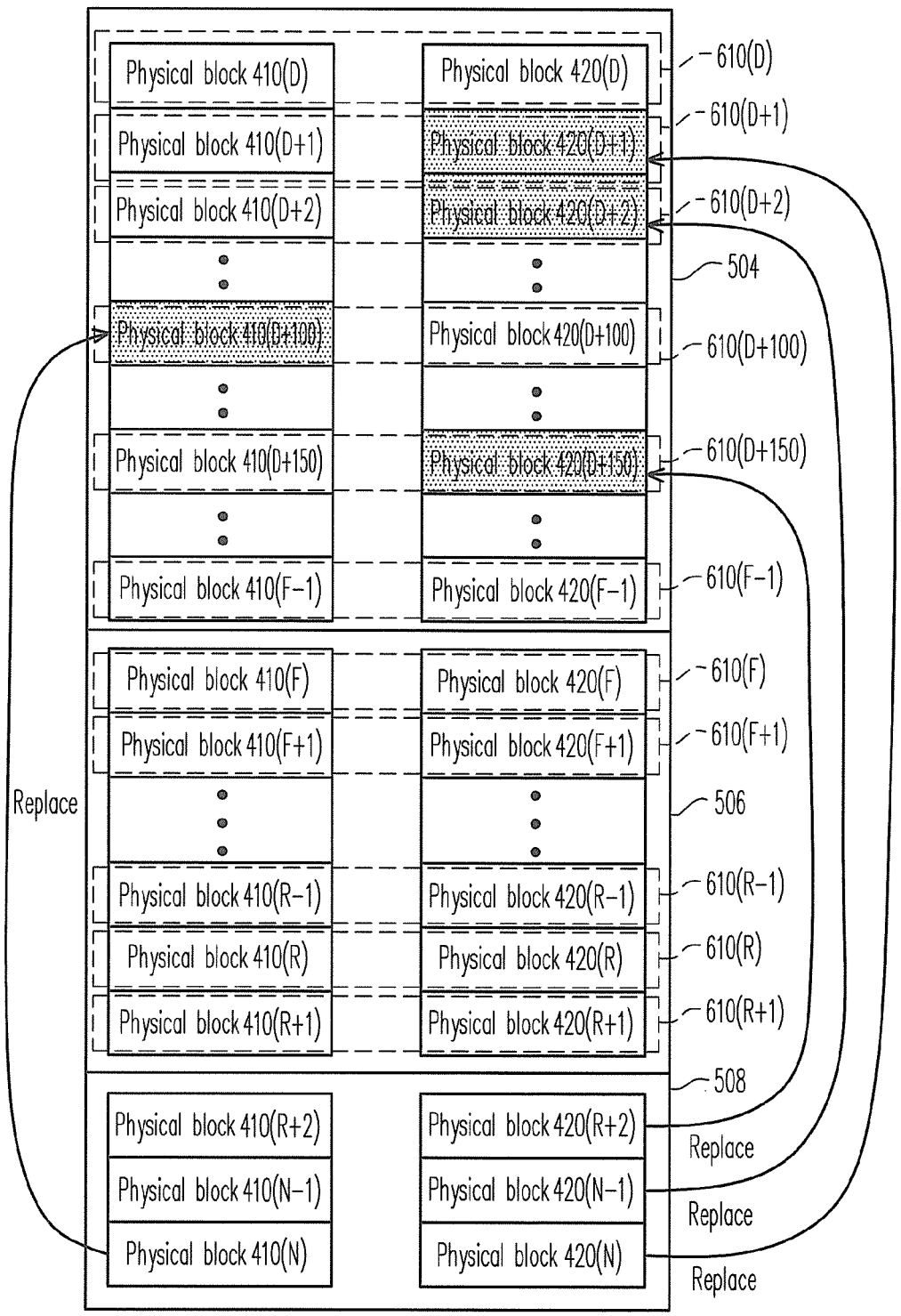
FIG. 10B illustrates another example of how a bad physical block is processed according to the second exemplary embodiment of the present invention.

FIG. 10B illustrates another example of how a bad physical block is processed according to the second exemplary embodiment of the present invention.

Referring to FIG. 10B, if the configurations of the free area 506 and the replacement area 508 are as shown in FIG. 9 and the physical block 420(D+150) of the second sub memory module 420 turns into a bad physical block, the memory management circuit 202 identifies available physical blocks in the replacement area 508 that do not belong to the second sub memory module according to the replacement physical block queue table and accordingly executes the replacement physical unit recovery procedure.

In the replacement physical unit recovery procedure, the memory management circuit 202 associates any physical unit that contains no valid data in the free area 506 with the replacement area 508. For example, as shown in FIG. 10B, if the physical unit 610(R+2) does not contain any valid data, the memory management circuit 202 associates the physical block 410(R+2) and the physical block 420(R+2) of the physical unit 610(R+2) with the replacement area 508. Thus, the memory management circuit 202 replaces the damaged physical block 420(D+150) with the physical block 420(R+2) and records the physical block 410(R+1) in the replacement physical block queue table.

In particular, if all the physical units in the free area 506 contain valid data and a bad physical block is detected, the memory management circuit 202 cannot instantly get a physical unit from the free area 506 to be recovered to the replacement area 508. Thus, in the present exemplary embodiment, during the operation of the memory storage apparatus 100, the memory management circuit 202 monitors whether the number of physical units in the free area 506 that contain no valid data is smaller than a prepared replacement block number, and when the number of physical units in the free area 506 that contain no valid data is smaller than the prepared replacement block number, the memory management circuit 202 executes a data merging procedure to erase the physical units in the data area 504 that contain no valid data and associates the erased physical units with the free area 506.

Namely, in the present exemplary embodiment, while executing a write command from the host system 1000, the memory management circuit 202 keeps getting physical blocks from the free area 506 as substitute physical blocks for writing data as long as the number of available physical units in the free area 506 is not smaller than the prepared replacement block number, so that execution of the data merging procedure can be avoided and the access efficiency of the memory storage apparatus 100 can be improved.

Figure 11A:
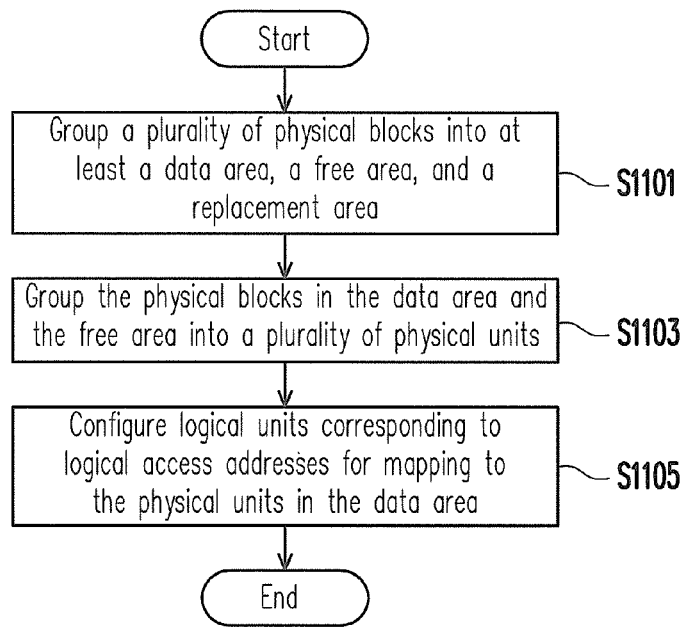
FIG. 11A and FIG. 11B are flowcharts of a block management method according to the second exemplary embodiment of the present invention.
Figure 11B:
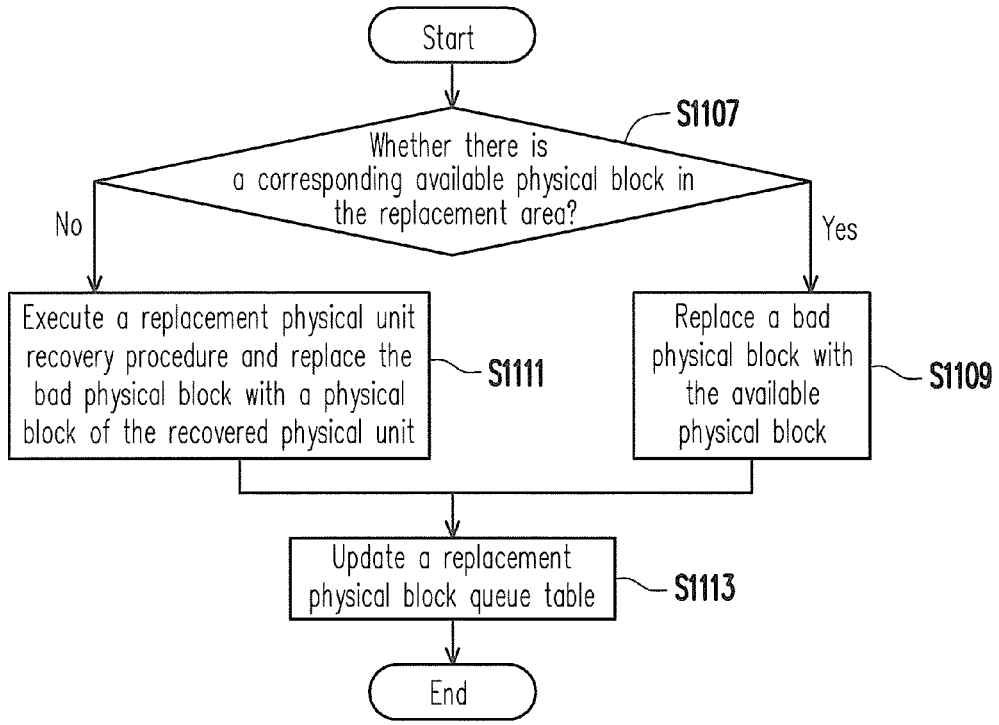

FIG. 11A and FIG. 11B are flowcharts of a block management method according to the second exemplary embodiment of the present invention, wherein FIG. 11A illustrates the management steps when the memory storage apparatus 100 is initialized, and FIG. 11B illustrates the management steps when a bad physical block is detected during the operation of the memory storage apparatus 100.

Referring to FIG. 11A, in step S1101, the memory management circuit 202 groups the physical blocks into at least a data area 504, a free area 506, and a replacement area 508. The configurations of the data area 504, the free area 506, and the replacement area 508 have been described above (as shown in FIG. 9) therefore will not be described herein.

In step S1103, the memory management circuit 202 groups the physical blocks in the data area 504 and the free area 506 into a plurality of physical units. Besides, in step S1105, the memory management circuit 202 configures logical units corresponding to logical access addresses for mapping to the physical units in the data area 504. The technique of grouping the physical blocks into the physical units to be mapped to the logical units has been described above (as shown in FIG. 9) therefore will not be described herein.

After the initialization procedure in FIG. 11A is completed, during the operation of the memory storage apparatus 100, the memory management circuit 202 constantly monitors all the physical blocks, and when a bad physical block is detected, the memory management circuit 202 executes the steps illustrated in FIG. 11B.

Referring to FIG. 11B, in step S1107, the memory management circuit 202 determines whether there is a corresponding available physical block in the replacement area 508. To be specific, as described above, the memory management circuit 202 determines whether there is any physical block for replacing the bad physical block according to the sub memory module corresponding to the bad physical block and the replacement physical block queue table.

If there is an available physical block in the replacement area 508, in step S1109, the memory management circuit 202 replaces the bad physical block with the available physical block.

If there is no available physical block in the replacement area 508, in step S1111, the memory management circuit 202 executes the replacement physical unit recovery procedure and replaces the bad physical block with a physical block in the recovered physical unit.

Thereafter, in step S1113, the memory management circuit 202 updates the replacement physical block queue table.

In summary, through a block management method provided by an exemplary embodiment of the present invention, the physical blocks in a memory storage apparatus can be effectively used. Particularly, in a block management method provided by an exemplary embodiment of the present invention, the number of available physical blocks in the free area can be increased in the same rewritable non-volatile memory module, so that more physical blocks can be used as substitute physical blocks while executing write commands. Accordingly, the data merging procedure can be executed for less number of times, and the access efficiency of the rewritable non-volatile memory module can be improved. In addition, when a bad physical block is detected, an available physical block can be instantly gotten for replacing the bad physical block through the block management method in the present exemplary embodiment. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A block management method, for managing a plurality of physical blocks of a rewritable non-volatile memory, the block management method comprising:
   grouping the physical blocks into at least a data area, a free area, and a replacement area;
   when one of the physical blocks belonging to the physical units of the data area becomes a bad physical block, getting a physical block among the physical blocks of the replacement area and replacing the bad physical block with the gotten physical block; and
   associating a physical block that contains no valid data among the physical blocks of the free area with the replacement area.

2. A block management method, for managing a plurality of physical blocks of a rewritable non-volatile memory, wherein the physical blocks respectively belong to a first sub memory module and a second sub memory module, the block management method comprising:
   grouping the physical blocks into at least a data area, a free area, and a replacement area;
   grouping the physical blocks in the data area and the free area into a plurality of physical units, wherein each of the physical units comprises one of the physical blocks of the first sub memory module and one of the physical blocks of the second sub memory module;
   when one of the physical blocks belonging to the first sub memory module in the data area becomes a bad physical block, getting a physical block among the physical blocks belonging to the first sub memory module in the replacement area and replacing the bad physical block with the gotten physical block;
   determining whether the number of the physical blocks belonging to the first sub memory module in the replacement area is smaller than a prepared replacement block number; and
   when the number of the physical blocks belonging to the first sub memory module in the replacement area is smaller than the prepared replacement block number, executing a replacement physical unit recovery procedure,
   wherein the replacement physical unit recovery procedure comprises:
      associating one of the physical units that contains no valid data in the free area with the replacement area.

3. The block management method according to claim 2 further comprising maintaining a replacement physical block queue table to record the physical blocks belonging to the replacement area.

4. The block management method according to claim 2, wherein the replacement physical unit recovery procedure further comprises:
   erasing one of the physical units in the data area by executing at least one write command, wherein data stored in the erased physical unit is all invalid data; and
   associating the erased physical unit with the free area.

5. A block management method, for managing a plurality of physical blocks of a rewritable non-volatile memory, wherein the physical blocks respectively belong to a first sub memory module and a second sub memory module, the block management method comprising:
   grouping the physical blocks into at least a data area, a free area, and a replacement area;
   grouping the physical blocks in the data area and the free area into a plurality of physical units, wherein each of the physical units comprises one of the physical blocks of the first sub memory module and one of the physical blocks of the second sub memory module;
   when one of the physical blocks belonging to the first sub memory module in the data area becomes a bad physical block, determining whether there is an available physical block among the physical blocks belonging to the first sub memory module in the replacement area;
   when there is the available physical block among the physical blocks belonging to the first sub memory module in the replacement area, replacing the bad physical block with the available physical block; and
   when there is no available physical block among the physical blocks belonging to the first sub memory module in the replacement area, associating one of a plurality of physical units that contains no valid data among the physical units of the free area with the replacement area and replacing the bad physical block with a physical block belonging to the first sub memory module in the physical unit.

6. The block management method according to claim 5 further comprising:
   determining whether the number of the physical units that contain no valid data in the free area is smaller than a prepared replacement block number; and
   when the number of the physical units that contain no valid data in the free area is smaller than the prepared replacement block number, erasing one of the physical units belonging to the data area by executing at least one write command, and associating the erased physical unit with the free area,
   wherein data stored in the erased physical unit is all invalid data.

7. A memory controller, for managing a rewritable non-volatile memory module, wherein the rewritable non-volatile memory module has a plurality of physical blocks, the memory controller comprising:
   a host interface, configured to couple to a host system;
   a memory interface, configured to couple to the rewritable non-volatile memory module; and
   a memory management circuit, coupled to the host interface and the memory interface, wherein the memory management circuit groups the physical blocks into at least a data area, a free area, and a replacement area and groups the physical blocks of the data area and the free area into a plurality of physical units,
   wherein when one of the physical blocks belonging to the physical units of the data area becomes a bad physical block, the memory management circuit further gets a physical block among the physical blocks of the replacement area and replaces the bad physical block with the selected physical block,
   wherein the memory management circuit further associates one of the physical units that contains no valid data in the free area with the replacement area.

8. A memory controller, for managing a rewritable non-volatile memory module, wherein the rewritable non-volatile memory module has a plurality of physical blocks, and the physical blocks respectively belong to a first sub memory module and a second sub memory module, the memory controller comprising:

a host interface, configured to couple to a host system;

a memory interface, configured to couple to the rewritable non-volatile memory module; and a memory management circuit, coupled to the host interface and the memory interface, and configured to group the physical blocks into at least a data area, a free area, and a replacement area and group the physical blocks of the data area and the free area into a plurality of physical units, wherein each of the physical units comprises one of the physical blocks of the first sub memory module and one of the physical blocks of the second sub memory module, wherein when one of the physical blocks belonging to the first sub memory module in the data area becomes a bad physical block, the memory management circuit further gets a physical block among the physical blocks of the first sub memory module in the replacement area and replaces the bad physical block with the gotten physical block, wherein the memory management circuit further determines whether the number of the physical blocks belonging to the first sub memory module in the replacement area is smaller than a prepared replacement block number, wherein when the number of the physical blocks belonging to the first sub memory module in the replacement area is smaller than the prepared replacement block number, the memory management circuit further associates one of the physical units that contains no valid data in the free area with the replacement area.

9. The memory controller according to claim 8, wherein the memory management circuit further maintains a replacement physical block queue table to record the physical blocks belonging to the replacement area.

10. The memory controller according to claim 8, wherein the memory management circuit further erases one of the physical units belonging to the data area by executing at least one write command and associates the erased physical unit with the free area, wherein data stored in the erased physical unit is all invalid data.

11. A memory controller, for managing a rewritable non-volatile memory module, wherein the rewritable non-volatile memory module has a plurality of physical blocks, and the physical blocks respectively belong to a first sub memory module and a second sub memory module, the memory controller comprising:

a host interface, configured to couple to a host system;

a memory interface, configured to couple to the rewritable non-volatile memory module; and a memory management circuit, coupled to the host interface and the memory interface, and configured to group the physical blocks into at least a data area, a free area, and a replacement area and group the physical blocks of the data area and the free area into a plurality of physical units, wherein each of the physical units comprises one of the physical blocks of the first sub memory module and one of the physical blocks of the second sub memory module, wherein when one of the physical blocks belonging to the first sub memory module in the data area becomes a bad physical block, the memory management circuit further determines whether there is an available physical block among the physical blocks belonging to the first sub memory module in the replacement area, wherein when there is the available physical block among the physical blocks belonging to the first sub memory module in the replacement area, the memory management circuit further replaces the bad physical block with the available physical block, wherein when there is no available physical block among the physical blocks belonging to the first sub memory module in the replacement area, the memory management circuit further associates one of a plurality of physical units that contains no valid data among the physical units of the free area with the replacement area and replaces the bad physical block with a physical block belonging to the first sub memory module in the physical unit.

12. The memory controller according to claim 11, wherein the memory management circuit further determines whether the number of the physical units that contain no valid data in the free area is smaller than a prepared replacement block number, wherein when the number of the physical units that contain no valid data in the free area is smaller than the prepared replacement block number, the memory management circuit further erases one of the physical units belonging to the data area by executing at least one write command and associates the erased physical unit with the free area, wherein data stored in the erased physical unit is all invalid data.

13. A memory storage apparatus, comprising:

a connector, configured to couple to a host system;

a rewritable non-volatile memory module, having a plurality of physical blocks; and a memory controller, coupled to the connector and the rewritable non-volatile memory module, wherein the memory controller groups the physical blocks into at least a data area, a free area, and a replacement area and groups the physical blocks in the data area and the free area into a plurality of physical units, wherein when one of the physical blocks belonging to the physical units of the data area becomes into a bad physical block, the memory controller further gets a physical block among the physical blocks of the replacement area and replaces the bad physical block with the gotten physical block, wherein the memory controller further associates one of the physical units that contains no valid data in the free area with the replacement area.

14. A memory storage apparatus, comprising:

a connector, configured to couple to a host system;

a rewritable non-volatile memory module, having a plurality of physical blocks, wherein the physical blocks respectively belong to a first sub memory module and a second sub memory module; and a memory controller, coupled to the connector and the rewritable non-volatile memory module, wherein the memory controller groups the physical blocks into at least a data area, a free area, and a replacement area and groups the physical blocks in the data area and the free area into a plurality of physical units, wherein each of the physical units comprises one of the physical blocks of the first sub memory module and one of the physical blocks of the second sub memory module, wherein when one of the physical blocks belonging to the first sub memory module in the data area becomes a bad physical block, the memory controller further gets a physical block among the physical blocks belonging to the first sub memory module in the replacement area and replaces the bad physical block with the gotten physical block, wherein the memory controller further determines whether the number of the physical blocks belonging to the first sub memory module in the replacement area is smaller than a prepared replacement block number, wherein when the number of the physical blocks belonging to the first sub memory module in the replacement area is smaller than the prepared replacement block number, the memory controller further gets a physical block among the physical blocks belonging to the first sub memory module in the replacement area, replaces the bad physical block with the gotten physical block, and associates one of the physical units that contains no valid data in the free area with the replacement area.

15. The memory storage apparatus according to claim 14, wherein the memory controller further maintains a replacement physical block queue table to record the physical blocks of the replacement area.

16. The memory storage apparatus according to claim 14, wherein the memory controller further erases one of the physical units belonging to the data area by executing at least one write command and associates the erased physical unit with the free area, wherein data stored in the erased physical unit is all invalid data.

17. A memory storage apparatus, comprising:
a connector, configured to couple to a host system;
a rewritable non-volatile memory module, having a plurality of physical blocks, wherein the physical blocks respectively belong to a first sub memory module and a second sub memory module; and
a memory controller, coupled to the connector and the rewritable non-volatile memory module,
wherein the memory controller groups the physical blocks into at least a data area, a free area, and a replacement area and groups the physical blocks in the data area and the free area into a plurality of physical units, wherein each of the physical units comprises one of the physical blocks of the first sub memory module and one of the physical blocks of the second sub memory module,
wherein when one of the physical blocks belonging to the first sub memory module in the data area turns into a bad physical block, the memory controller further determines whether there is an available physical block among the physical blocks belonging to the first sub memory module in the replacement area,
wherein when there is the available physical block among the physical blocks belonging to the first sub memory module in the replacement area, the memory controller further replaces the bad physical block with the available physical block,
wherein when there is no available physical block among the physical blocks belonging to the first sub memory module in the replacement area, the memory controller further associates one of a plurality of physical units that contains no valid data among the physical units of the free area with the replacement area and replaces the bad physical block with a physical block belonging to the first sub memory module in the physical unit.

18. The memory storage apparatus according to claim 17, wherein the memory controller further determines whether the number of the physical units that contain no valid data in the free area is smaller than a prepared replacement block number, wherein when the number of the physical units that contain no valid data in the free area is smaller than the prepared replacement block number, the memory controller further erases one of the physical units belonging to the data area by executing at least one write command and associates the erased physical unit with the free area, wherein data stored in the erased physical unit is all invalid data.

19. A block management method, for managing a plurality of physical blocks of a rewritable non-volatile memory, the block management method comprising:
grouping the physical blocks into at least a data area, a free area, and a replacement area, wherein the physical blocks in the data area are used for storing data from a host system, the physical blocks in the free area are used for substituting the physical blocks in the data area, and the physical blocks in the replacement area are used for replacing damaged physical blocks;
detecting a physical block number of the replacement area; and
when the physical block number of the replacement area is smaller than a prepared replacement block number, associating at least one physical block in the data area or the free area with the replacement area so that the physical blocks belonging to the replacement area are variable.

* * * * *